United States Patent
Stave (10) Patent No.: US 11,977,751 B2
(45) Date of Patent: May 7, 2024

(54) ON-DIE TERMINATION CONFIGURATION FOR A MEMORY DEVICE

(71) Applicant: Micron Technology, Inc., Boise, ID (US)

(72) Inventor: Eric J. Stave, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 12 days.

(21) Appl. No.: 17/494,701

(22) Filed: Oct. 5, 2021

(65) Prior Publication Data

US 2023/0117882 A1    Apr. 20, 2023

(51) Int. Cl.
*G06F 3/00* (2006.01)
*G06F 3/06* (2006.01)

(52) U.S. Cl.
CPC .......... *G06F 3/0629* (2013.01); *G06F 3/0604* (2013.01); *G06F 3/0679* (2013.01)

(58) Field of Classification Search
None
See application file for complete search history.

(56) References Cited

U.S. PATENT DOCUMENTS

2015/0170724 A1* 6/2015 Shaeffer .............. G11C 11/4063
365/191

* cited by examiner

Primary Examiner — Midys Rojas
(74) Attorney, Agent, or Firm — Holland & Hart LLP (57) ABSTRACT

Methods, systems, and devices for on-die termination configuration for a memory device are described. In some examples, a memory device may determine a connection option from a set of connections options for which an ODT pin of the memory device is configured. Each connection option may correspond to a termination configuration for a different pin, such as a command and address (CA) pin, a clock (CK) pin, or a chip select (CS). Based on the determined connection option, the memory device may identify a respective termination option for each of the different pins, such as a first termination option for the CA pin, a second termination option for the CK pin, and a third termination option for the CS pin, and configure each of the different pins according to the respective termination option for that pin.

20 Claims, 6 Drawing Sheets

ON-DIE TERMINATION CONFIGURATION FOR A MEMORY DEVICE

FIELD OF TECHNOLOGY

The following relates generally to one or more systems for memory and more specifically to on-die termination (ODT) configuration for a memory device.

BACKGROUND

Memory devices are widely used to store information in various electronic devices such as computers, user devices, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

DETAILED DESCRIPTION

In some examples, a memory device may include a set of pins. A pin may be described as a conductive input or output point of a device. Each pin may be coupled with a signal line. A host device may utilize signal lines to communicate with the memory device. In some examples, as the signal travels from the host device to the memory device along the signal line, it may be reflected back in the opposite direction. Signal reflection may be a result of discontinuous impedance along the signal line and may negatively impact the signal by changing characteristics of the signal (e.g., changing phase, amplitude, frequency, etc. of the signal). To mitigate the effects of signal reflection, the memory device may implement resistive termination techniques. Some memory devices, upon powering on, may select from two different termination configurations. For example, such a memory device may select from a first termination configuration or a second termination configuration. Each termination configuration may specify whether or not a specific pin of the memory device may be resistively terminated using an on-die termination, which may refer to a resistive termination within the memory device (e.g., on a same die as a memory array within he memory device).

The memory device may select the termination configuration based on a state of an on-die termination (ODT) pin of the memory device. For example, if the memory device senses that the ODT pin is biased to a high voltage, it may select the first termination configuration, whereas, if the memory device senses that the ODT pin is biased to a low voltage, it may select the second termination configuration. However, in some cases, it may be beneficial to have more than two termination configurations when the memory device powers on. More termination configurations may allow a memory system more flexibility when it comes to pin termination. In some examples, after the memory device powers on, the memory device may update or change the two termination configurations which may offer some flexibility. However, the signaling involved in changing or updating the two termination configurations may introduce a delay in system initialization.

As described herein, upon powering on the memory device, the memory device may select, for one or more pins, a termination configuration from three or more termination configurations. For example, the memory device may select from a first termination configuration, a second termination configuration, or a third termination configuration. The memory device may select the termination configuration based on a state of the ODT pin of the memory device. The ODT pin may be biased to a first voltage, biased to a second voltage, biased to a third voltage, or electrically floating. If the ODT pin is biased to the first voltage, the memory device may select the first termination configuration. If the ODT pin is biased to the second voltage, the memory device may select the second termination configuration. If the ODT pin is biased to the third voltage or is electrically floating, the memory device may select the third termination configuration. In some cases, four states of the ODT pin may be supported along with a fourth termination configuration (e.g., the ODT pin being biased to the third voltage or being electrically floating may respectively correspond to third and fourth possible states of the ODT pin). By having more than two termination configurations, the memory device may have more flexibility in regards to pin termination, including at power-up, when compared to having only two termination configurations.

Features of the disclosure are initially described in the context of a system as described with reference to FIG. 1. Features of the disclosure are described in the context of component diagrams as described with reference to FIGS. 2 and 3. These and other features of the disclosure are further illustrated by and described with reference to an apparatus diagram and flowcharts that relate to ODT configuration for a memory device as described with reference to FIGS. 4-6. In some cases, a termination configuration as described herein for a pin of a given type may be applied to multiple pins of that same type, where a memory device includes multiple pins of that same type. For example, a termination configuration for a command and address (CA) pin of a memory device may be used for multiple CA pins (e.g., one or more CA buses) included in the memory device.

Figure 1:
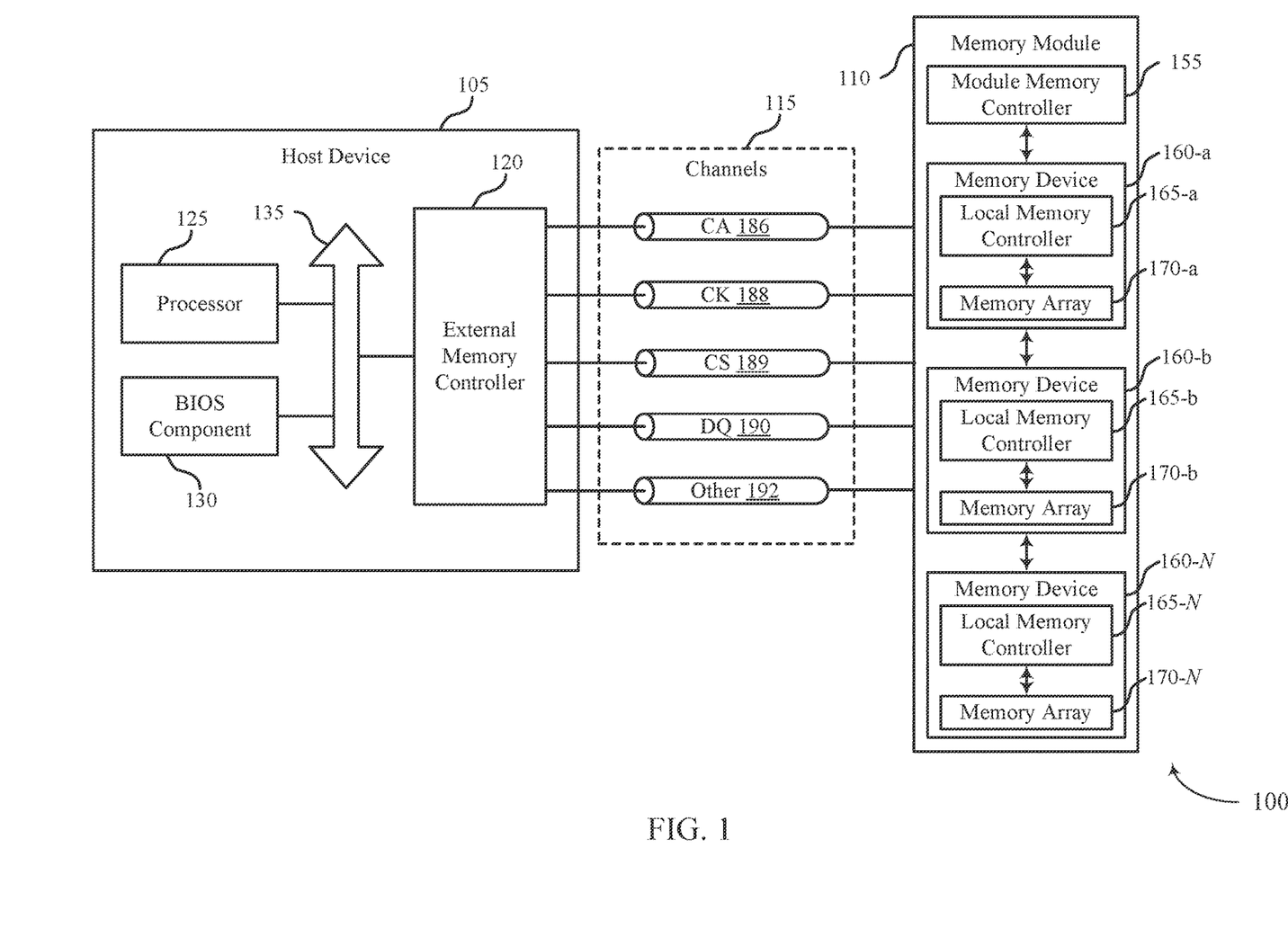
FIG. 1 illustrates an example of a system that supports on-die termination (ODT) configuration for a memory device in accordance with examples as disclosed herein.

FIG. 1 illustrates an example of a system 100 that supports ODT configuration for a memory device in accordance with examples as disclosed herein. The system 100 may include a host device 105, a memory module 110, and a plurality of channels 115 coupling the host device 105 with the memory module 110. The system 100 may include one or more memory modules 110, but aspects of the one or more memory modules 110 may be described in the context of a single memory device (e.g., memory module 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory module 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory module 110 may be an independent device or a component that is operable to provide physical memory addresses/space that may be used or referenced by the system 100. In some examples, a memory module 110 may be configurable to work with one or more different types of host devices. Signaling between the host device 105 and the memory module 110 may be operable to support one or more of: modulation schemes to modulate the signals, various pin configurations for communicating the signals, various form factors for physical packaging of the host device 105 and the memory module 110, clock signaling and synchronization between the host device 105 and the memory module 110, timing conventions, or other factors.

The memory module 110 may be operable to store data for the components of the host device 105. In some examples, the memory module 110 may act as a secondary-type or dependent-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of the host device 105 may be coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

In some examples, the system 100 or the host device 105 may include various peripheral components. The peripheral components may be any input device or output device, or an interface for such devices, that may be integrated into or with the system 100 or the host device 105. Examples may include one or more of: a disk controller, a sound controller, a graphics controller, an Ethernet controller, a modem, a universal serial bus (USB) controller, a serial or parallel port, or a peripheral card slot such as peripheral component interconnect (PCI) or specialized graphics ports. The peripheral component(s) may be other components understood by a person having ordinary skill in the art as a peripheral.

In some examples, the system 100 or the host device 105 may include an I/O controller. An I/O controller may manage data communication between the processor 125 and the peripheral component(s), input devices, or output devices. The I/O controller may manage peripherals that are not integrated into or with the system 100 or the host device 105. In some examples, the I/O controller may represent a physical connection or port to external peripheral components.

In some examples, the system 100 or the host device 105 may include an input component, an output component, or both. An input component may represent a device or signal external to the system 100 that provides information, signals, or data to the system 100 or its components. In some examples, and input component may include a user interface or interface with or between other devices. In some examples, an input component may be a peripheral that interfaces with system 100 via one or more peripheral components or may be managed by an I/O controller. An output component may represent a device or signal external to the system 100 operable to receive an output from the system 100 or any of its components. Examples of an output component may include a display, audio speakers, a printing device, another processor on a printed circuit board, and others. In some examples, an output may be a peripheral that interfaces with the system 100 via one or more peripheral components or may be managed by an I/O controller.

The memory module 110 may include a module memory controller 155 and one or more memory devices 160 (e.g., memory chips) to support a desired capacity or a specified capacity for data storage. Each memory device 160 (e.g., memory device 160-*a*, memory device 160-*b*, memory device 160-N) may include a local memory controller 165 (e.g., local memory controller 165-*a*, local memory controller 165-*b*, local memory controller 165-N) and one or more memory arrays 170 (e.g., memory array 170-*a*, memory array 170-*b*, memory array 170-N). A memory array 170 may be a collection (e.g., one or more grids, one or more banks, one or more tiles, one or more sections) of memory cells, with each memory cell being operable to store at least one bit of data. A memory device 160 including two or more memory dies may be referred to as a multi-die memory or a multi-die package or a multi-chip memory or a multi-chip package.

The module memory controller 155 may include circuits, logic, or components operable to control operation of the memory module 110. The module memory controller 155 may include the hardware, the firmware, or the instructions that enable the memory module 110 to perform various operations and may be operable to receive, transmit, or execute commands, data, or control information related to the components of the memory module 110. The module memory controller 155 may be operable to communicate with one or more of the external memory controller 120, the one or more memory devices 160, or the processor 125. In some examples, the module memory controller 155 may control operation of the memory module 110 described herein in conjunction with the local memory controller 165 of the memory device 160.

A local memory controller 165 (e.g., local to a memory device 160) may include circuits, logic, or components operable to control operation of the memory device 160. In some examples, a local memory controller 165 may be operable to communicate (e.g., receive or transmit data or commands or both) with the module memory controller 155. In some examples, a memory module 110 may not include a module memory controller 155, and a local memory controller 165 or the external memory controller 120 may perform various functions described herein. As such, a local memory controller 165 may be operable to communicate with the module memory controller 155, with other local memory controllers 165, or directly with the external memory controller 120, or the processor 125, or a combination thereof. Examples of components that may be included in the module memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the module memory controller 155 or local memory controller 165 or both.

The external memory controller 120 may be operable to enable communication of one or more of information, data, or commands between components of the system 100 or the host device 105 (e.g., the processor 125) and the memory module 110. The external memory controller 120 may convert or translate communications exchanged between the components of the host device 105 and the memory module 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105.

Although the external memory controller 120 is depicted as being external to the memory module 110, in some examples, the external memory controller 120, or its functions described herein, may be implemented by one or more components of a memory module 110 (e.g., a module memory controller 155, a local memory controller 165) or vice versa.

The components of the host device 105 may exchange information with the memory module 110 or memory devices 160 therein using one or more channels 115. The channels 115 may be operable to support communications between the external memory controller 120 and the memory module 110 or memory devices 160 therein. Each channel 115 may be examples of transmission mediums that carry information between the host device 105 and a memory device 160. In some cases, one of more of the channels 115 may be shared by multiple memory devices 160 of the memory module 110 (e.g., a channel 115 may be coupled with a corresponding pin at each of the memory devices 160). Each channel 115 may include one or more signal paths or transmission mediums (e.g., conductors) between terminals associated with the components of the system 100. A signal path may be an example of a conductive path operable to carry a signal. For example, a channel 115 may include a first terminal including one or more pins or pads at the host device 105 and one or more pins or pads at the memory module 110 or memory devices 160 therein. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more CA channels 186, one or more clock (CK) signal channels 188, one or more chip select (CS) channels 189, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a CK signal). In DDR signaling, two modulation symbols (e.g., signal levels) of a signal may be registered for each clock cycle (e.g., on both a rising edge and a falling edge of a CK signal).

In some examples, CA channels 186 may be operable to communicate commands between the host device 105 and the memory module 110 including control information associated with the commands (e.g., address information). For example, commands carried by the CA channel 186 may include a read command with an address of the desired data. In some examples, a CA channel 186 may include any quantity of signal paths to decode one or more of address or command data (e.g., eight or nine signal paths). In some examples, the CA channel 186 may be coupled to one or more CA pins included in each memory device 160.

In some examples, CK signal channels 188 may be operable to communicate one or more CK signals between the host device 105 and the memory module 110. Each CK signal may be operable to oscillate between a high state and a low state, and may support coordination (e.g., in time) between actions of the host device 105 and the memory module 110. In some examples, the CK signal may be single ended. In some examples, the CK signal may provide a timing reference for command and addressing operations for the memory module 110, or other system-wide operations for the memory module 110. A CK signal therefore may be referred to as a control CK signal, a command CK signal, or a system CK signal. A system CK signal may be generated by a system clock, which may include one or more hardware components (e.g., oscillators, crystals, logic gates, transistors). In some examples, the CK signal channel 188 may be coupled to one or more CK pins included in each memory device 160.

In some examples, a CS channel 189 may be operable to communicate one or more CS signals between the host device 105 and the memory module 110 The purpose of a CS signal may be to enable or disable a memory device 160 or a memory die therein. In some examples, the CS channel 189 may be coupled to one or more CS pins included in each memory device 160.

In some examples, data channels 190 may be operable to communicate one or more of data or control information between the host device 105 and the memory module 110. For example, the data channels 190 may communicate information (e.g., bi-directional) to be written to the memory module 110 or information read from the memory module 110.

The channels 115 may each include any quantity of signal paths (including a single signal path) coupled with any quantity of pins. In some examples, a channel 115 may include multiple individual signal paths. For example, a channel may be ×4 (e.g., including four signal paths, and coupled with four corresponding pins at each of one or more memory devices 160), ×8 (e.g., including eight signal paths, and coupled with eight corresponding pins at each of one or more memory devices 160), ×16 (including sixteen signal paths, and coupled with sixteen corresponding pins at each of one or more memory devices 160), etc.

In some examples, the one or more other channels 192 may include one or more error detection code (EDC) channels. The EDC channels may be operable to communicate error detection signals, such as checksums, to improve system reliability. An EDC channel may include any quantity of signal paths.

Signals communicated over the channels 115 may be modulated using one or more different modulation schemes. In some examples, a binary-symbol (or binary-level) modulation scheme may be used to modulate signals communicated between the host device 105 and the memory module 110. A binary-symbol modulation scheme may be an example of a M-ary modulation scheme where M is equal to two. Each symbol of a binary-symbol modulation scheme may be operable to represent one bit of digital data (e.g., a symbol may represent a logic 1 or a logic 0). Examples of binary-symbol modulation schemes include, but are not limited to, non-return-to-zero (NRZ), unipolar encoding, bipolar encoding, Manchester encoding, pulse amplitude modulation (PAM) having two symbols (e.g., PAM2), or others.

In some examples, a multi-symbol (or multi-level) modulation scheme may be used to modulate signals communicated between the host device 105 and the memory module 110. A multi-symbol modulation scheme may be an example of a M-ary modulation scheme where M is greater than or equal to three. Each symbol of a multi-symbol modulation scheme may be operable to represent more than one bit of digital data (e.g., a symbol may represent a logic 00, a logic 01, a logic 10, or a logic 11). Examples of multi-symbol modulation schemes include, but are not limited to, PAM3, PAM4, PAM8, etc., quadrature amplitude modulation (QAM), quadrature phase shift keying (QPSK), or others. A multi-symbol signal (e.g., a PAM3 signal or a PAM4 signal) may be a signal that is modulated using a modulation scheme that includes at least three levels to encode more than one bit of information. Multi-symbol modulation schemes and symbols may alternatively be referred to as non-binary, multi-bit, or higher-order modulation schemes and symbols.

In some examples, the signals communicated between the host device 105 and the memory module 110 (e.g., CA signals, CK signals, or CS signals) may experience signal reflection. Signal reflection may occur when impedance is not constant along a signal line and can negatively impact the signal. To reduce signal reflection, the memory module 110 may implement resistive termination techniques. That is, the memory module may couple a signal line (e.g., CA signal line, CK signal line, or CS signal line) to a voltage source (e.g., a fixed voltage reference or supply, or a ground reference), and a resistive component may be situated between the signal line and the voltage source.

In some cases, a resistive termination for a channel 115 may include one or more ODTs (on-die terminations) implemented by one or more memory devices 160. An ODT for a pin may include a memory device 160 coupling the pin to a voltage source within a memory die of the memory device 160 via a resistive component within the memory die. If a signal line is shared by multiple memory devices 160 and coupled with a respective corresponding pin at each of the multiple memory devices 160, the overall termination impedance (e.g., resistance) with which the signal line is terminated may depend on the termination configuration for the respective corresponding pin at each of the multiple memory devices 160. As one example, if a CA channel 186 includes a signal line that is coupled with a first CA pin at a first memory device 160 and a second CA pin at a second memory device 160, then the first memory device 160 implementing a 50 ohm ODT for the first CA pin while the second memory device does not implement any ODT for the second CA pin may result in an overall termination impedance of 50 ohms for the signal line, and the first memory device 160 implementing a 50 ohm ODT for the first CA pin while the second memory device also implements a 50 ohm ODT for the second CA pin may result in an overall termination impedance of 25 ohms for the signal line (due to the two 50 ohm ODTs electrically being in parallel).

In some examples, each memory device 160 may include an ODT pin and the state of the ODT pin may dictate the termination configuration for one or more pins at the respective memory device 160. A termination configuration may indicate whether or how the one or more pins of the memory device 160 are terminated internally within the memory device 160. Some memory devices 160 may support two different termination configurations. For example, a first termination configuration may specify that the one or more CA pins, the one or more CS pins, and the one or more CK pins of the memory device 160 are to be resistively terminated (e.g., using a 40 ohm resistor). Alternatively, a second termination configuration may specify that the one or more CA pins, the one or more CS pins, or the one or more CK pins of the memory device 160 are not to be resistively terminated.

The memory device 160 may select either the first termination configuration or the second termination configuration based on a state (or a connection option) of the respective ODT pin. For example, if the memory device 160 detects a high voltage (e.g., Vcc, which may be a positive voltage supply or reference) on the ODT pin, the memory device 160 may terminate the pins according to the first termination configuration and if the memory device 160 detects a low voltage (e.g., Vss, which may be a negative voltage supply or reference or a ground voltage) on the ODT pin, the memory device 160 may terminate the pins according to the second termination configuration. The state of the ODT pin may be separately (e.g., independently) configured for each memory device 160 included in the memory module. As such, the pins of different memory devices 160 may be terminated according to configurations that may be separately specified for each of the memory devices 160. Moreover, each memory device 160 may share a common CA signal line, CK signal line, or CS signal line and the total termination resistance for the common CA signal line, CK signal line, or the CS signal line may be based on the state of the ODT pin at each memory device 160.

However, an implementation as described above may only allow for two termination configurations at power-up. For example, a termination configuration where, for each individual memory device 160, the pins of the memory device 160 subject to termination based on the state of the ODT pin are all terminated or are all not terminated. This may result in each pin and signal line subject to termination based on the state of the ODT pins of the different memory devices 160 having a same overall termination impedance. But different signaling lines subject to termination based on the state of an ODT pin may have different characteristics, and hence different overall termination impedances may be desirable for different ones of the signal lines, including upon power-up. For example, some pins of the memory device 160 subject to termination based on the state of an ODT pin may be more loaded (e.g., capacitively loaded) than others. For example, the CK pin may be more loaded than the CA pin or the CS pin. As such, it may be beneficial to allow a memory device 160 to select from more than two termination configurations.

As described herein, the memory device 160 may select, for one or more pins of the memory device 160, a termination configuration from at least three termination configurations as part of a power-up procedure. For example, the memory device 160 may select from at least a first termination configuration, a second termination configuration, and a third termination configuration. As an example, the first termination configuration may specify to terminate all the corresponding pins (e.g., the one or more CK pins, the one or more CA pins, and the one or more CS pins) of the memory device 160 using a resistor (e.g., a 40 ohm resistor). The second termination configuration may specify to not terminate all the pins of the memory device 160. The third configuration may specify to terminate one type of pin (e.g., the one or more CK pins) and to not terminate the other types of pins (e.g., the one or more CS pins or the one or more CA pins) of the memory device 160.

In some examples, the memory device 160 may select either the first termination configuration, the second termination configuration, or the third termination configuration based on a state of the ODT pin. For example, if the ODT pin is biased to a first voltage, the memory device 160 may terminate the pins according to the first termination configuration. If the ODT pin is biased to a second voltage, the memory device 160 may terminate the pins according to the second termination configuration. If the ODT pin is biased to a third voltage or is electrically floating, the memory device 160 may terminate the pins according to the third termination configuration. Using the method as described herein may allow for a specific signal line (e.g., the CK signal line) to have a different overall termination resistance compared to the other signal lines (e.g., the CS signal line and the CA signal line). As such, the memory device 160 may customize the termination resistance for a specific signal line which may support higher signaling speeds, improved reliability of signaling, or both, among other possible advantages.

Figure 2:
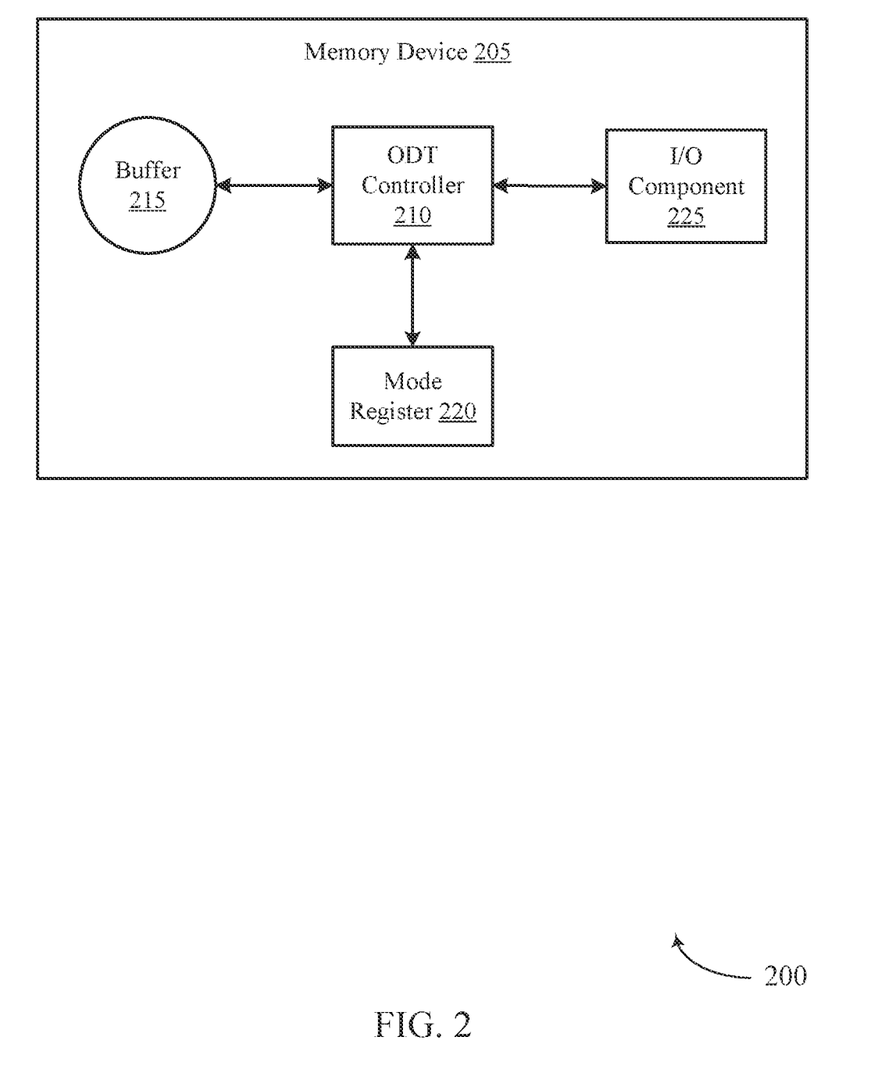
FIGS. 2 and 3 illustrate examples of a component diagram that supports ODT configuration for a memory device in accordance with examples as disclosed herein.

FIG. 2 illustrates an example of a component diagram 200 that supports ODT configuration for a memory device in accordance with examples as disclosed herein. In some examples, the component diagram 200 may implement aspects of a system 100. For example, the component diagram 200 may include a memory device 205 which may be an example of a memory device 160 as described in FIG. 1. The memory device 160 may include an ODT controller 210, a buffer 215, a mode register 220, and an I/O component 225. Each of the buffer 215, the mode register 220, and the I/O component 225 may be coupled to or in electronic communication with the ODT controller 210.

As described in FIG. 1, a memory device 205 may determine a termination configuration for pins of the memory device 205 based on a state (or connection option) of an ODT pin of the memory device 205. In some examples, the ODT pin of the memory device 205 may be coupled to the ODT controller 210 and the ODT controller 210 may be configured to sense the state of the ODT pin. The ODT pin may have multiple states. For example, a first state may be that the ODT pin is coupled to a first voltage, a second state may be that the ODT pin is coupled to a second voltage, and third ODT state may be that the ODT pin is coupled to a third voltage. The first voltage, the second voltage, and the third voltage may be different from one another. For example, the first voltage may be a positive voltage (e.g., Vcc), the second voltage may be a ground voltage or a negative voltage (e.g., Vss), and the third voltage may be a voltage in between or different (e.g., greater than) from the first voltage and the second voltage (e.g., Vpp). As one example, the first voltage may be 1.1 volts, the second voltage may be ground, and the third voltage may be 1.8 volts. An additional fourth state (or alternative third state) may be that the ODT pin may be electrically floating. In such case, the memory device 205 may include multiple (e.g., two or more) sense circuits situated between the ODT controller 210 and the ODT pin.

The ODT controller 210 may determine the state of the ODT pin by sensing (or detecting) a voltage of the ODT pin (e.g., when the memory device 205 powers up). For example, if the ODT controller 210 senses that a voltage of the ODT pin is equal or near the first voltage, the ODT controller 210 may determine that the ODT pin is in the first state. In some examples, upon determining the state of the ODT pin, the ODT controller 210 may store two or more bits in a buffer 215, where a logic state of the two or more bits are representative of the determined state of the ODT pin. For example, the ODT controller 210 may store a 11 if the first state is detected, a 00 if the second state is detected, a 10 is the third state if detected, or a 01 if the fourth state is detected. In some examples, the state of the ODT pin is decided during manufacturing of the memory device 205. That is, the state of the ODT pin is predetermined.

The ODT controller 210 may select a termination configuration from a set of termination configurations based on the state of the ODT pin. Each termination configuration may specify whether or not to terminate pins (e.g., CA pins, CK pins, or CS pins) of the memory device 205 using a resistor. The set of termination configurations may be stored at a mode register 220 included in the memory device 205. In some examples, there may be multiple fields in the mode register 220. As one example, there may be a field for each pin type and for each termination configuration option for a specific pin type. For example, if the memory device 205 includes one pin type, there may be three fields in the mode register 220 for three different configuration options. In some examples, the memory device 205 may include multiple mode registers 220. For example, the memory device 205 may include a mode register for each type of pin (e.g., a respective mode register for a CA pin, a CK pin, and a CS pin).

In some examples, the set of termination configurations may include at least three termination configurations. Table 1 illustrates three different termination configuration options (e.g., Option A, Option B, and Option C). Option A may specify to terminate the CA pin using a 40Ω resistor, terminate the CS pin using a 40Ω resistor, and terminate the CK pin using a 40Ω resistor. Alternatively, Option B may specify to not terminate the CA pin, the CS pin, and the CK pin. Option C may specify to not terminate the CA pin and the CS pin, but to terminate the CK pin using a 40Ω resistor. As used herein, a resistor may refer to any component configured to have a particular amount of resistance and may alternative be referred to as a resistive component. Although, three termination configurations option are shown in Table 1, it is understood that there may be more than three termination configurations options (e.g., four termination configuration options). The termination configuration options in Table 1 may illustrate the default termination configuration options (e.g., the termination configurations when the memory device 205 powers on). In some examples, the termination configuration options may be updated or changed during operation of the memory device 205.

TABLE 1

|  | Option A | Option B | Option C |
|---|---|---|---|
| CA pins | 40 Ω | OFF | OFF |
| CS pins | 40 Ω | OFF | OFF |
| CK pins | 40 Ω | OFF | 40 Ω |

Each termination configuration of the set of termination configurations may correspond to a state of the ODT pin. For example, Option A may correspond to the first state of the ODT pin, Option B may correspond to the second state of the ODT pin, and Option C may correspond to the third state of the ODT pin. The ODT controller 210 may determine a state of the ODT pin and look at the mode register 220 to determine which termination configuration of the set of termination configuration to implement. As one example, the ODT controller 210 may determine that the ODT pin is in the first state and determine (from the mode register 220) to terminate the pins of the memory device 205 according to Option A. In some examples, the ODT controller 210 may determine the state of the ODT pin by reading the logic state of the two or more bits stored in the buffer 215. Once the ODT controller 210 determines the termination configuration, the ODT controller 210 may instruct the I/O component 225 to terminate the pins of the memory device 205 according to the determined termination configuration. Once the memory device 205 terminates the pins according to the determined termination configuration, the memory device 205 may turn "off" or stop supplying power to the one or more of the ODT controller 210, the mode register 220, the buffer 215, or the I/O component 225. The methods as described herein may allow a memory device 205 to select from three or more termination configuration options which may allow a memory system to customize a combined terminal resistance for a specific signal line.

Figure 3:
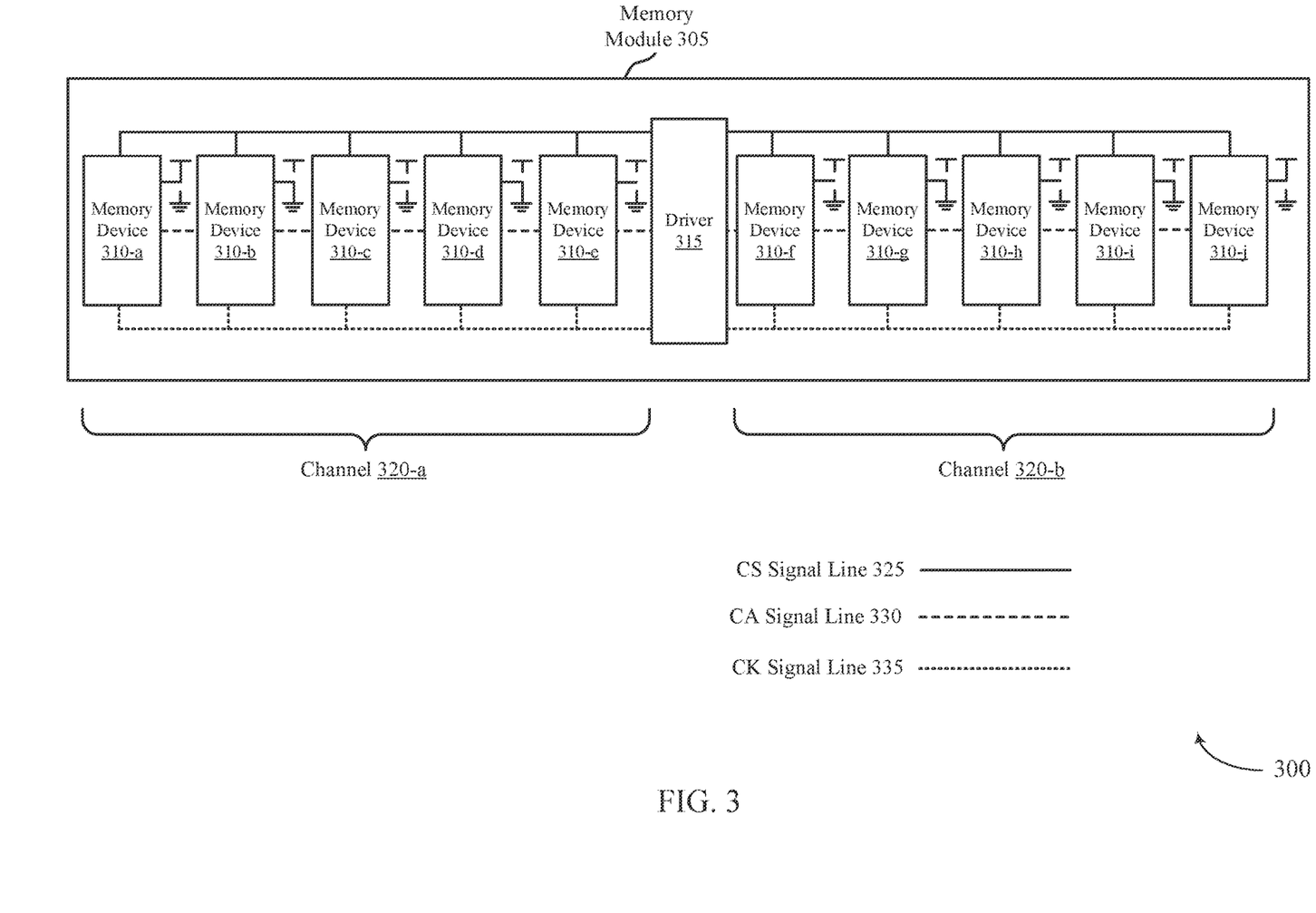

FIG. 3 illustrates an example of a component diagram 300 that supports ODT configuration for a memory module in accordance with examples as disclosed herein. In some examples, the component diagram 300 may implement aspects of a system 100 and a component diagram 200. For example, the component diagram 300 may include memory devices 310 which may be examples of memory devices 160 as described with reference to FIG. 1 and memory devices 205 as described with reference to FIG. 2. The component diagram 300 may also include a memory module 305 which includes the memory devices 310 as well as a driver 315. The memory devices 310 may otherwise be known as DRAM chips, the driver 315 may otherwise be known as a register clock driver (RCD), and the memory module 305 may otherwise be known as a dual in-line memory module (DIMM).

The memory module 305 may be divided into a channel 320-a and a channel 320-b. The channel 320-a may include a memory device 310-a, a memory device 310-b, a memory device 310-c, a memory device 310-d, and a memory device 310-e. Moreover, the channel 320-a may include five additional memory devices 310 that are situated on the back-side of the memory module 305 (not shown in FIG. 3). The channel 320-b may include a memory device 310-f, a memory device 310-g, a memory device 310-h, a memory device 310-i, and a memory device 310-j. Similar to the channel 320-a, the channel 320-b may include five additional memory devices 310 that are situated on the back-side of the memory module 305 (not shown in FIG. 3). In some examples, the channel 320-a may operate independent from the channel 320-b. Although FIG. 3 shows the memory module 305 including five memory devices 310 (on one side) per channel 320, it is understood that any number of memory devices 310 may be included in the memory module 305.

In some examples, the memory module 305 may communicate with a host device. The memory module 305 may be coupled with the memory module 305 via the driver 315. The driver 315 may receive signals from the host device and redistribute the signals to components of the memory module 305. In some examples, the driver 315 may have multiple pins that allow for communication with the components of the memory module 305. For example, the driver 315 may have a one or more CS pins, one or more CK pins, and one or more CA pin. A CK pin of the driver 315 may be coupled to a CK signal line 335 that is routed to respective CK pins of memory devices 310 of channel 320-a (e.g., 10 memory devices 310) or coupled to a CK signal line 335 that is routed to respective CK pins of memory devices 310 of channel 320-b (e.g., 10 memory devices 310). Alternatively, a CS pin of the driver 315 may be coupled to a CS signal line 325 that is routed to the front-side or back-side memory devices 310 of the channel 320-a (e.g., 5 memory devices) or coupled to a CS signal line 325 that is routed to the front-side or back-side memory devices 310 of the channel 320-b (e.g., 5 memory devices). A CA signal line 330 may be routed to the memory devices 310 of the memory module 305 a similar manner as the CS signal line 325. Because the CK signal line 335 may be shared among more memory devices 310 than the CS signal line 325 and the CA signal line 330, the CK pin may be more loaded and may require different signaling requirements when compared to the CS pin and the CA pin.

As described in FIGS. 1 and 2, each memory device 310 of memory module 305 may determine whether or not to resistively terminate one or more pins (e.g., CA pins, CS pins, or CK pins) of the memory device 310 based on a state of an ODT pin included in each memory device 310. In some examples, internally terminating pins at one memory device 310 may affect other memory devices 310. For example, resistively terminating one or more CA pins at the memory device 310-*b* and resistively terminating one or more CA pins at the memory device 310-*e* may result in a combined parallel resistance on the shared CA signal line 330. In some memory modules 305, each memory device 310 may select from two different termination configurations. For example, if the ODT pin of a respective memory device 310 is tied high (as shown at memory device 310-*a*), the memory device 310 may internally terminate all pin types, whereas if the ODT pin is tied low (e.g., memory device 310-*b*), the memory device 310 may not internally terminate all pin types. Only allowing for two different termination configurations, however, may not offer the memory module 305 a desired degree of flexibility when considering the different signal requirements for each pin type. For example, the two termination configurations may either specify that all pin types are resistively terminated or that all pin types are not resistively terminated. Using such methods may result in each type of signal line having the same combined termination resistance. But as discussed above, different pin types may have different signaling requirements and as such, different pin types may benefit from having a different combined termination resistance.

As described herein, each memory device 310 may select from three or more termination configurations based on a state of a respective ODT pin included in each memory device 310. Allowing a memory device 310 to select from three or more different termination configurations may allow for customizable combined termination resistances for different signal lines of the memory module 305. In one example, a first termination configuration may specify to internally terminate all types of pins. For example, the first termination configuration may specify to terminate each of the one or more CA pins, the one or more CS pins, or the one or more CK pins of a respective memory device 310 using a 40 ohm resistor. A second termination configuration may specify to not internally terminate all type of pins. For example, the second termination configuration may specify to not terminate each of the one or more CA pins, the one or more CS pins, or the one or more CK pins of a respective memory device 310. A third termination configuration may specify to terminate one type of pin while not terminating the other types of pins. For example, the third termination configuration may specify to terminate each of the one or more CK pins using 40 ohm resistor and to not terminate each of the one or more CA pins and the one or more CS pins of a respective memory device 310.

In some examples, each one of the three or more termination configurations may be associated with a state of an ODT pin included in the memory device 310. In some examples, a first state of the ODT pin may include the ODT pin being biased to a first voltage (e.g., a positive voltage), a second state of the ODT pin may include the ODT pin being biased to a second voltage (e.g., a ground voltage), and a third state may include the ODT pin electrically floating. As one example, the first termination configuration may be associated with the first state, the second termination configuration may be associated with second state, and the third termination configuration may be associated with the third state.

Each memory device 310 may sense the state of the ODT pin when the memory module 305 powers on. As shown in FIG. 3, the ODT pin of the memory device 310-*a* may be biased to the first voltage. Alternatively, the ODT pins of the memory device 310-*b* and the memory device 310-*d* may be biased to the second voltage. Moreover, the ODT pins of the memory device 310-*c* and the memory device 310-*d* may be electrically floating. This ODT pin configuration may result in CS signal line 325 and the CA signal line having the same combined termination resistance and the CK signal line 335 to have a combined termination resistance different from the CS signal line 325 and the CA signal line 330. That is, the methods as described herein may allow for different signal lines of the memory module to have a different combined termination resistances which may support higher signaling speeds, improved reliability of signaling, or both, among other possible advantages.

Figure 4:
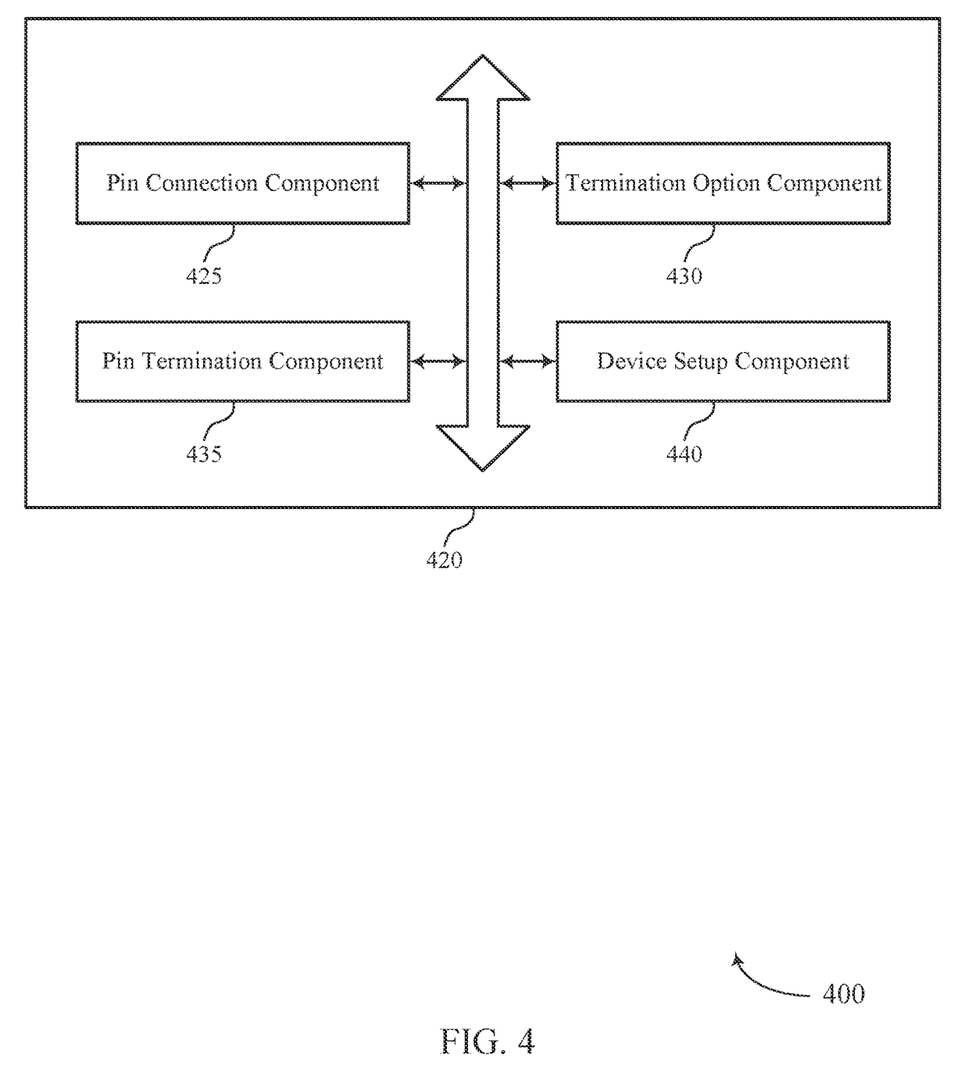
FIG. 4 shows a block diagram of a memory device that supports ODT configuration for a memory device in accordance with examples as disclosed herein.

FIG. 4 shows a block diagram 400 of a memory device 420 that supports ODT configuration for a memory device in accordance with examples as disclosed herein. The Memory Device 420 may be an example of aspects of a Memory Device as described with reference to FIGS. 1 through 3. The memory device 420, or various components thereof, may be an example of means for performing various aspects of ODT configuration for a memory device as described herein. For example, the memory device 420 may include a pin connection component 425, a termination option component 430, a pin termination component 435, a device setup component 440, or any combination thereof. Each of these components may communicate, directly or indirectly, with one another (e.g., via one or more buses).

The pin connection component 425 may be configured as or otherwise support a means for determining, from among a set of candidate connection options including three or more candidate connection options, a connection option according to which an ODT pin of a memory device is configured, where each candidate connection option of the set of candidate connection options corresponds to a respective termination configuration for one or more additional pins of the memory device (e.g., a CA pin of the memory device, a CK pin of the memory device, or a CS pin of the memory device). The termination option component 430 may be configured as or otherwise support a means for identifying a respective termination option for each of the one or more additional pins of the memory device (e.g., a first termination option for the CA pin of the memory device, a second termination option for the CK pin of the memory device, and a third termination option for the CS pin of the memory device) based at least in part on the respective termination configuration for the connection option according to which the ODT pin is configured. The pin termination component 435 may be configured as or otherwise support a means for configuring each of the one or more additional pins of the memory device according to the respective termination option for the additional pin (e.g., the CA pin, the CK pin, or the CS pin according to a first termination option, a second termination option, or the third termination option respectively).

In some examples, the set of candidate connection options includes at least a first connection option that includes the ODT pin being biased at a first voltage, a second connection option that includes the ODT pin being biased at a second voltage, and a third connection option that includes the ODT pin being biased at a third voltage or being electrically floating. In some examples, the first voltage, the second voltage, and the third voltage are different from one another.

In some examples, the third connection option includes the ODT pin being biased at the third voltage. In some examples, the set of candidate connection options includes a fourth connection option that includes the ODT pin being electrically floating.

In some examples, the one or more additional pins of the memory device may include a CA pin, and to support identifying the respective termination option for the CA pin, the termination option component 430 may be configured as or otherwise support a means for determining, based at least in part on the determined connection option, whether the CA pin is terminated via a resistive termination within the memory device or the CA pin is not terminated within the memory device.

In some examples, the one or more additional pins of the memory device may include a CK pin, and to support identifying the respective termination option for the CK pin, the termination option component 430 may be configured as or otherwise support a means for determining, based at least in part on the determined connection option, whether the CK pin is terminated via a resistive termination within the memory device or the CK pin is not terminated within the memory device.

In some examples, the one or more additional pins of the memory device may include a CS pin, and to support identifying the respective termination option for the CS pin, the termination option component 430 may be configured as or otherwise support a means for determining, based at least in part on the determined connection option, whether the CS pin is terminated via a resistive termination within the memory device or the CS pin is not terminated within the memory device.

In some examples, to support determining the connection option, the pin connection component 425 may be configured as or otherwise support a means for detecting a voltage of the ODT pin, where the detected voltage corresponds to the connection option.

In some examples, the device setup component 440 may be configured as or otherwise support a means for powering on the memory device, where determining the connection option from among the set of candidate connection options is based at least in part on powering on the memory device.

Figure 5:
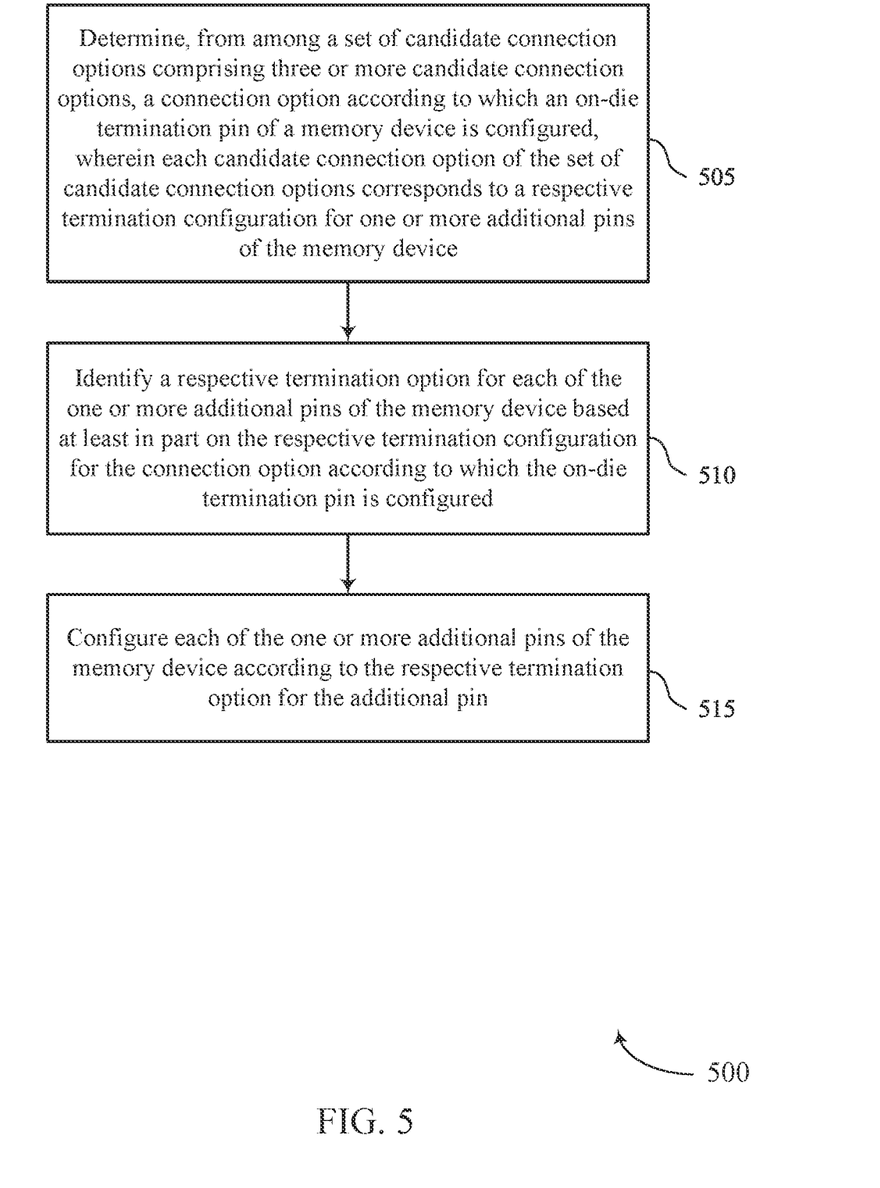
FIGS. 5 and 6 show flowcharts illustrating a method or methods that support ODT configuration for a memory device in accordance with examples as disclosed herein.

FIG. 5 shows a flowchart illustrating a method 500 that supports ODT configuration for a memory device in accordance with examples as disclosed herein. The operations of method 500 may be implemented by a Memory Device or its components as described herein. For example, the operations of method 500 may be performed by a Memory Device as described with reference to FIGS. 1 through 4. In some examples, a Memory Device may execute a set of instructions to control the functional elements of the device to perform the described functions. Additionally or alternatively, the Memory Device may perform aspects of the described functions using special-purpose hardware.

At 505, the method may include determining, from among a set of candidate connection options including three or more candidate connection options, a connection option according to which an ODT pin of a memory device is configured, where each candidate connection option of the set of candidate connection options corresponds to a respective termination configuration for one or more additional pins of the memory device (e.g., a CA pin of the memory device, a CK pin of the memory device, and a CS pin of the memory device). The operations of 505 may be performed in accordance with examples as disclosed herein. In some examples, aspects of the operations of 505 may be performed by a pin connection component 425 as described with reference to FIG. 4.

At 510, the method may include identifying a respective termination option for each of the one or more additional pins of the memory device (e.g., a first termination option for the CA pin of the memory device, a second termination option for the CK pin of the memory device, or a third termination option for the CS pin of the memory device) based at least in part on the respective termination configuration for the connection option according to which the ODT pin is configured. The operations of 510 may be performed in accordance with examples as disclosed herein. In some examples, aspects of the operations of 510 may be performed by a termination option component 430 as described with reference to FIG. 4.

At 515, the method may include configuring each of the one or more additional pins of the memory device according to the respective termination option for the additional pin (e.g., the CA pin, the CK pin, or the CS pin according to a first termination option, a second termination option, or the third termination option respectively. The operations of 515 may be performed in accordance with examples as disclosed herein. In some examples, aspects of the operations of 515 may be performed by a pin termination component 435 as described with reference to FIG. 4.

In some examples, an apparatus as described herein may perform a method or methods, such as the method 500. The apparatus may include, features, circuitry, logic, means, or instructions (e.g., a non-transitory computer-readable medium storing instructions executable by a processor), or any combination thereof for performing the following aspects of the present disclosure:

Aspect 1: The apparatus, including features, circuitry, logic, means, or instructions, or any combination thereof for determining, from among a set of candidate connection options including three or more candidate connection options, a connection option according to which an ODT pin of a memory device is configured, where each candidate connection option of the set of candidate connection options corresponds to a respective termination configuration for one or more additional pins of the memory device; identifying a respective termination option for each of the one or more additional pins of the memory device based at least in part on the respective termination configuration for the connection option according to which the ODT pin is configured; and configuring each of the one or more additional pins of the memory device according to the respective termination option for the additional pin.

Aspect 2: The apparatus of aspect 1, further including operations, features, circuitry, logic, means, or instructions, or any combination thereof for the set of candidate connection options includes at least a first connection option that includes the ODT pin being biased at a first voltage, a second connection option that includes the ODT pin being biased at a second voltage, and a third connection option that includes the ODT pin being biased at a third voltage or being electrically floating, and where the first voltage, the second voltage, and the third voltage are different from one another.

Aspect 3: The apparatus of aspect 2, further including operations, features, circuitry, logic, means, or instructions, or any combination thereof for the third connection option includes the ODT pin being biased at the third voltage, and where the set of candidate connection options includes a fourth connection option that includes the ODT pin being electrically floating.

Aspect 4: The apparatus of any of aspects 2 through 3 where the one or more additional pins of the memory device comprise a CA pin, and where identifying the respective termination option for the CA pin, further includes operations, features, circuitry, logic, means, or instructions, or any combination thereof for determining, based at least in part on the determined connection option, whether the CA pin is terminated via a resistive termination within the memory device or the CA pin is not terminated within the memory device.

Aspect 5: The apparatus of any of aspects 2 through 4 where the one or more additional pins of the memory device comprise a CK pin, and where identifying the respective termination option for the CK pin, further includes operations, features, circuitry, logic, means, or instructions, or any combination thereof for determining, based at least in part on the determined connection option, whether the CK pin is terminated via a resistive termination within the memory device or the CK pin is not terminated within the memory device.

Aspect 6: The apparatus of any of aspects 2 through 5 where the one or more additional pins of the memory device comprise a CS pin, and where identifying the respective termination option for the CS pin, further includes operations, features, circuitry, logic, means, or instructions, or any combination thereof for determining, based at least in part on the determined connection option, whether the CS pin is terminated via a resistive termination within the memory device or the CS pin is not terminated within the memory device.

Aspect 7: The apparatus of any of aspects 1 through 6 where determining the connection option, further includes operations, features, circuitry, logic, means, or instructions, or any combination thereof for detecting a voltage of the ODT pin, where the detected voltage corresponds to the connection option.

Aspect 8: The apparatus of any of aspects 1 through 7, further including operations, features, circuitry, logic, means, or instructions, or any combination thereof for powering on the memory device, where determining the connection option from among the set of candidate connection options is based at least in part on powering on the memory device.

Figure 6:
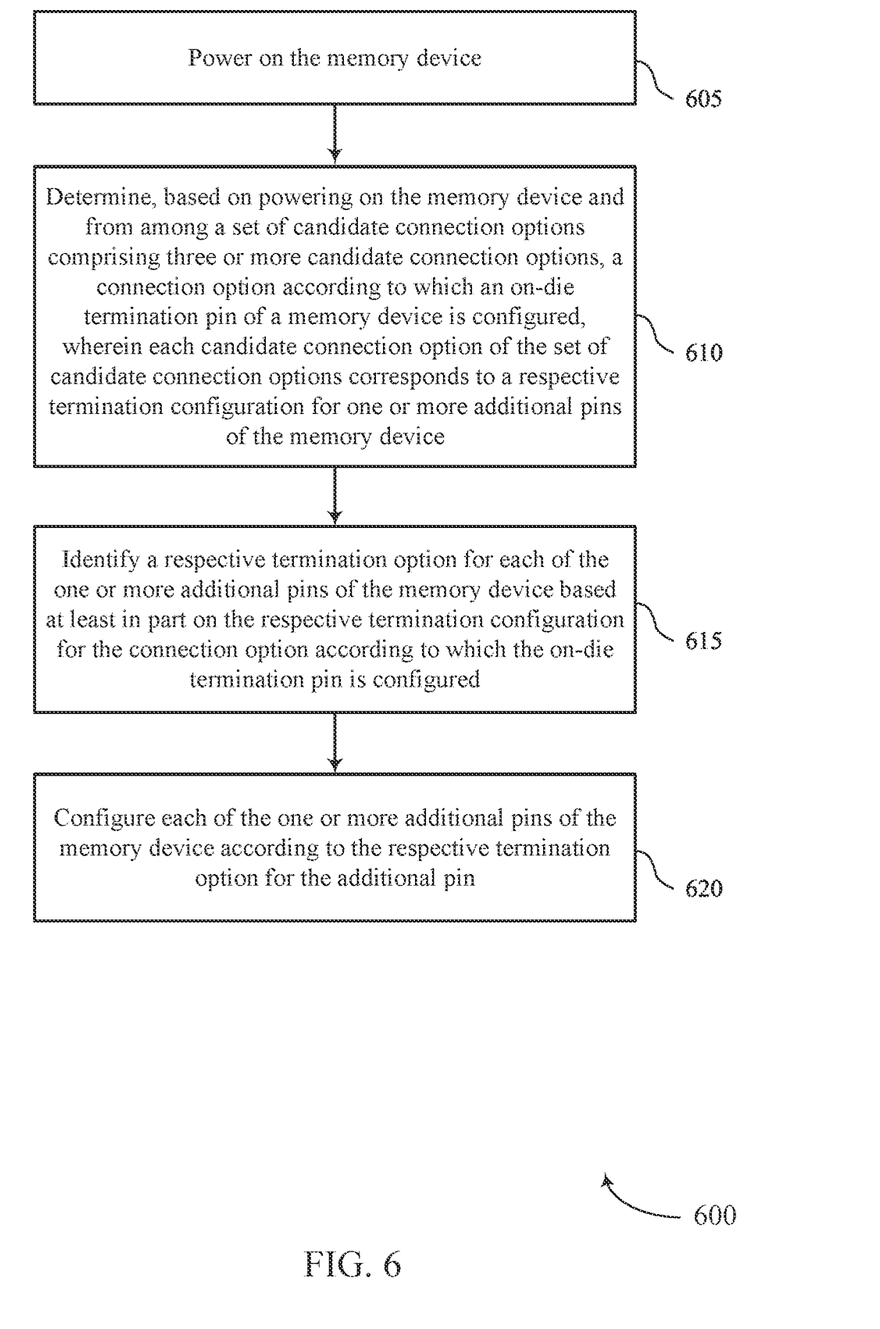

FIG. 6 shows a flowchart illustrating a method 600 that supports ODT configuration for a memory device in accordance with examples as disclosed herein. The operations of method 600 may be implemented by a Memory Device or its components as described herein. For example, the operations of method 600 may be performed by a Memory Device as described with reference to FIGS. 1 through 4. In some examples, a Memory Device may execute a set of instructions to control the functional elements of the device to perform the described functions. Additionally or alternatively, the Memory Device may perform aspects of the described functions using special-purpose hardware.

At 605, the method may include powering on the memory device. The operations of 605 may be performed in accordance with examples as disclosed herein. In some examples, aspects of the operations of 605 may be performed by a device setup component 440 as described with reference to FIG. 4.

At 610, the method may include determining, based on powering on the memory device and from among a set of candidate connection options including three or more candidate connection options, a connection option according to which an ODT pin of a memory device is configured, where each candidate connection option of the set of candidate connection options corresponds to a respective termination configuration for one or more additional pins of the memory device (e.g., a CA pin of the memory device, a CK pin of the memory device, or a CS pin of the memory device). The operations of 610 may be performed in accordance with examples as disclosed herein. In some examples, aspects of the operations of 610 may be performed by a pin connection component 425 as described with reference to FIG. 4.

At 615, the method may include identifying a respective termination option for each of the one or more additional pins of the memory device (e.g., a first termination option for the CA pin of the memory device, a second termination option for the CK pin of the memory device, or a third termination option for the CS pin of the memory device) based at least in part on the respective termination configuration for the connection option according to which the ODT pin is configured. The operations of 615 may be performed in accordance with examples as disclosed herein. In some examples, aspects of the operations of 615 may be performed by a termination option component 430 as described with reference to FIG. 4.

At 620, the method may include configuring each of the one or more additional pins of the memory device according to the respective termination option for the additional pin (e.g., the CA pin, the CK pin, or the CS pin according to the first termination option, the second termination option, or the third termination option respectively). The operations of 620 may be performed in accordance with examples as disclosed herein. In some examples, aspects of the operations of 620 may be performed by a pin termination component 435 as described with reference to FIG. 4.

It should be noted that the methods described herein describe possible implementations, and that the operations and the steps may be rearranged or otherwise modified and that other implementations are possible. Further, portions from two or more of the methods may be combined.

An apparatus is described. The following provides an overview of aspects of the apparatus as described herein:

Aspect 9: An apparatus, including: a memory device, the memory device including an ODT pin and a controller configured to cause the apparatus to: detect a state of the ODT pin, where the state is one of a plurality of potential states that includes three or more potential states; identify a termination configuration from a plurality of termination configurations based at least in part on the detected state of the ODT pin, the termination configuration corresponding to a respective termination option for each of one or more additional pins of the memory device; and configure each of the one or more additional pins according to the respective termination option for the additional pin that corresponds to the identified termination configuration.

Aspect 10: The apparatus of aspect 9, where the memory device further includes: a mode register configured to store the plurality of termination configurations, where the controller is configured to identify the termination configuration based at least in part on reading the termination configuration from the mode register.

Aspect 11: The apparatus of any of aspects 9 through 10, where the memory device further includes: a buffer configured to store two or more bits representative of a logic value that is based at least in part on the detected state of the ODT pin, where the controller is configured to identify the termination configuration based at least in part on the logic state represented by the two or more bits.

Aspect 12: The apparatus of any of aspects 9 through 11, where the plurality of potential states includes at least a first state that includes the ODT pin being biased at a first voltage, a second state that includes the ODT pin being biased at a second voltage, and a third state that includes the ODT pin being biased at a third voltage or being electrically floating.

Aspect 13: The apparatus of aspect 12, where the one or more additional pins of the memory device comprise a CA pin, and where, to identify the termination configuration from the plurality of termination configurations, the controller is configured to: determine, based at least in part on the detected state of the ODT pin, whether the CA pin is terminated via a resistive termination within the memory device or the CA pin is not terminated within the memory device.

Aspect 14: The apparatus of any of aspects 12 through 13, where the one or more additional pins of the memory device comprise a CK pin, and where, to identify the termination configuration from the plurality of termination configurations, the controller is configured to: determine, based at least in part on the detected state of the ODT pin, whether the CK pin is terminated via a resistive termination within the memory device or the CK pin is not terminated within the memory device.

Aspect 15: The apparatus of any of aspects 12 through 14, where the one or more additional pins of the memory device comprise a CS pin, and where, to identify the termination configuration from the plurality of termination configurations, the controller is configured to: determine, based at least in part on the detected state of the ODT pin, whether the CS pin is terminated via a resistive termination within the memory device or the CS pin is not terminated within the memory device.

An apparatus is described. The following provides an overview of aspects of the apparatus as described herein:

Aspect 16: An apparatus, including: a plurality of memory devices each including a respective ODT pin and a respective set of one or more additional pins; and one or more signal lines including a respective signal line for each of the one or more additional pins, where the respective signal line for an additional pin of the one or more additional pins is coupled with the corresponding additional pin of each memory device of the plurality of memory devices, where each memory device of the plurality of memory devices includes a respective controller configured to cause the memory device to: detect a state of the respective ODT pin of the memory device, where the state is one of a plurality of potential states that includes three or more potential states; and identify a termination configuration for each additional pin of the respective set of one or more additional pins of the memory device based at least in part on the detected state of the ODT pin of the memory device.

Aspect 17: The apparatus of aspect 16, where the plurality of potential states includes at least a first state that includes the ODT pin being biased at a first voltage, a second state that includes the ODT pin being biased at a second voltage, and a third state that includes the ODT pin being biased at a third voltage or being electrically floating.

Aspect 18: The apparatus of aspect 17, where the respective set of one or more additional pins for each memory device of the plurality of memory devices comprises a respective CA pin coupled with a CA line of the one or more signal lines, and where, to identify the termination configuration for the respective CA pin of a memory device, the respective controller of the memory device is configured to: determine, based at least in part on the detected state of the respective ODT pin, whether the respective CA pin is terminated via a resistive termination within the memory device or the respective CA pin is not terminated within the memory device.

Aspect 19: The apparatus of any of aspects 17 through 18, where the respective set of one or more additional pins for each memory device of the plurality of memory devices comprises a respective CK pin coupled with a CK line of the one or more signal lines, and where, to identify the termination configuration for the respective CK pin of a memory device, the respective controller of the memory device is configured to: determine, based at least in part on the detected state of the respective ODT pin, whether the respective CK pin is terminated via a resistive termination within the memory device or the respective CK pin is not terminated within the memory device.

Aspect 20: The apparatus of any of aspects 17 through 19, where the respective set of one or more additional pins for each memory device of the plurality of memory devices comprises a respective CS pin coupled with a CS line of the one or more signal lines, and where, to identify the termination configuration for the respective CS pin of a memory device, the respective controller of the memory device is configure to: determine, based at least in part on the detected state of the respective ODT pin, whether the respective CS pin is terminated via a resistive termination within the memory device or the respective CS pin is not terminated within the memory device.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
   determining, from among a set of candidate connection options comprising three or more candidate connection options, a connection option according to which an on-die termination pin of a memory device is configured, wherein each candidate connection option of the set of candidate connection options corresponds to a respective termination configuration for one or more additional pins of the memory device;
   identifying a respective termination option for each of the one or more additional pins of the memory device based at least in part on the respective termination configuration for the connection option according to which the on-die termination pin is configured; and
   configuring each of the one or more additional pins of the memory device according to the respective termination option for the additional pin.

2. The method of claim 1, wherein the set of candidate connection options comprises at least a first connection option that comprises the on-die termination pin being biased at a first voltage, a second connection option that comprises the on-die termination pin being biased at a second voltage, and a third connection option that comprises the on-die termination pin being biased at a third voltage or being electrically floating, wherein the first voltage, the second voltage, and the third voltage are different from one another.

3. The method of claim 2, wherein the third connection option comprises the on-die termination pin being biased at the third voltage, and wherein the set of candidate connection options comprises a fourth connection option that comprises the on-die termination pin being electrically floating.

4. The method of claim 2, wherein the one or more additional pins of the memory device comprise a command and address pin, and wherein identifying a first termination option for the command and address pin comprises:
   determining, based at least in part on the determined connection option, whether the command and address pin is terminated via a resistive termination within the memory device or the command and address pin is not terminated within the memory device.

5. The method of claim 2, wherein the one or more additional pins of the memory device comprise a clock pin, and wherein identifying a second termination option for the clock pin comprises:
   determining, based at least in part on the determined connection option, whether the clock pin is terminated via a resistive termination within the memory device or the clock pin is not terminated within the memory device.

6. The method of claim 2, wherein the one or more additional pins of the memory device comprise a chip select pin, and wherein identifying a third termination option for the chip select pin comprises:
   determining, based at least in part on the determined connection option, whether the chip select pin is terminated via a resistive termination within the memory device or the chip select pin is not terminated within the memory device.

7. The method of claim 1, wherein determining the connection option comprises:
   detecting a voltage of the on-die termination pin, wherein the detected voltage corresponds to the connection option.

8. The method of claim 1, further comprising:
   powering on the memory device, wherein determining the connection option from among the set of candidate connection options is based at least in part on powering on the memory device.

9. An apparatus, comprising:
   a memory device, the memory device comprising an on-die termination pin and a controller configured to cause the apparatus to:
   detect a state of the on-die termination pin, wherein the state is one of three or more states;
   identify a termination configuration from a plurality of termination configurations based at least in part on the detected state of the on-die termination pin; and
   configure each of one or more additional pins of the memory device according to the identified termination configuration.

10. The apparatus of claim 9, wherein the memory device further comprises:
    a mode register configured to store the plurality of termination configurations, wherein the controller is configured to identify the termination configuration based at least in part on reading the termination configuration from the mode register.

11. The apparatus of claim 9, wherein the memory device further comprises:
    a buffer configured to store two or more bits representative of a logic state that is based at least in part on the detected state of the on-die termination pin, wherein the controller is configured to identify the termination configuration based at least in part on the logic state represented by the two or more bits.

12. The apparatus of claim 9, wherein the three or more states comprises at least a first state that comprises the on-die termination pin being biased at a first voltage, a second state that comprises the on-die termination pin being biased at a second voltage, and a third state that comprises the on-die termination pin being biased at a third voltage or being electrically floating.

13. The apparatus of claim 12, wherein the one or more additional pins of the memory device comprise a command and address pin, and wherein, to identify the termination configuration from the plurality of termination configurations, the controller is configured to:
    determine, based at least in part on the detected state of the on-die termination pin, whether the command and address pin is terminated via a resistive termination within the memory device or the command and address pin is not terminated within the memory device.

14. The apparatus of claim 12, wherein the one or more additional pins of the memory device comprise a clock pin, and wherein, to identify the termination configuration from the plurality of termination configurations, the controller is configured to:
    determine, based at least in part on the detected state of the on-die termination pin, whether the clock pin is terminated via a resistive termination within the memory device or the clock pin is not terminated within the memory device.

15. The apparatus of claim 12, wherein the one or more additional pins of the memory device comprise a chip select pin, and wherein, to identify the termination configuration from the plurality of termination configurations, the controller is configured to:
determine, based at least in part on the detected state of the on-die termination pin, whether the chip select pin is terminated via a resistive termination within the memory device or the chip select pin is not terminated within the memory device.

16. An apparatus, comprising:
a plurality of memory devices each comprising a respective on-die termination pin and a respective set of one or more additional pins; and
one or more signal lines comprising a respective signal line for each of the one or more additional pins, wherein the respective signal line for an additional pin of the one or more additional pins is coupled with the corresponding additional pin of each memory device of the plurality of memory devices,
wherein each memory device of the plurality of memory devices comprises a respective controller configured to cause the memory device to:
detect a state of the respective on-die termination pin of the memory device, wherein the state is one of a plurality of potential states that comprises three or more potential states; and
identify a termination configuration for each additional pin of the respective set of one or more additional pins of the memory device based at least in part on the detected state of the on-die termination pin of the memory device.

17. The apparatus of claim 16, wherein the plurality of potential states comprises at least a first state that comprises the on-die termination pin being biased at a first voltage, a second state that comprises the on-die termination pin being biased at a second voltage, and a third state that comprises the on-die termination pin being biased at a third voltage or being electrically floating.

18. The apparatus of claim 17, wherein:
the respective set of one or more additional pins for each memory device of the plurality of memory devices comprises a respective command and address pin coupled with a command and address line of the one or more signal lines; and
to identify the termination configuration for the respective command and address pin of a memory device, the respective controller of the memory device is configured to:
determine, based at least in part on the detected state of the respective on-die termination pin, whether the respective command and address pin is terminated via a resistive termination within the memory device or the respective command and address pin is not terminated within the memory device.

19. The apparatus of claim 17, wherein:
the respective set of one or more additional pins for each memory device of the plurality of memory devices comprises a respective clock pin coupled with a clock line of the one or more signal lines; and
to identify the termination configuration for the respective clock pin of a memory device, the respective controller of the memory device is configured to:
determine, based at least in part on the detected state of the respective on-die termination pin, whether the respective clock pin is terminated via a resistive termination within the memory device or the respective clock pin is not terminated within the memory device.

20. The apparatus of claim 17, wherein:
the respective set of one or more additional pins for each memory device of the plurality of memory devices comprises a respective chip select pin coupled with a chip select line of the one or more signal lines; and
to identify the termination configuration for the respective chip select pin of a memory device, the respective controller of the memory device is configured to:
determine, based at least in part on the detected state of the respective on-die termination pin, whether the respective chip select pin is terminated via a resistive termination within the memory device or the respective chip select pin is not terminated within the memory device.

* * * * *